US012532749B2

(12) United States Patent
Zhang et al.

(10) Patent No.: US 12,532,749 B2
(45) Date of Patent: Jan. 20, 2026

(54) METHODS FOR FORMING VIA HOLE AND FILLING VIA HOLE IN FLEXIBLE SUBSTRATE

(71) Applicants: Beijing BOE Technology Development Co., Ltd., Beijing (CN); BOE TECHNOLOGY GROUP CO., LTD., Beijing (CN)

(72) Inventors: Shuo Zhang, Beijing (CN); Kui Liang, Beijing (CN); Tuo Sun, Beijing (CN); Chao Zhou, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 599 days.

(21) Appl. No.: 17/921,254

(22) PCT Filed: Nov. 26, 2021

(86) PCT No.: PCT/CN2021/133505
§ 371 (c)(1),
(2) Date: Oct. 25, 2022

(87) PCT Pub. No.: WO2023/092454
PCT Pub. Date: Jun. 1, 2023

(65) Prior Publication Data
US 2024/0222141 A1  Jul. 4, 2024

(51) Int. Cl.
*H01L 21/48* (2006.01)
*C25D 5/02* (2006.01)
(Continued)

(52) U.S. Cl.
CPC ............ *H01L 21/486* (2013.01); *C25D 5/022* (2013.01); *C25D 5/56* (2013.01); *C25D 7/123* (2013.01); *G03F 7/0035* (2013.01); *G03F 7/161* (2013.01)

(58) Field of Classification Search
None
See application file for complete search history.

(56) References Cited

U.S. PATENT DOCUMENTS 6,039,889 A     3/2000  Zhang et al.
6,666,964 B2 * 12/2003  Tanaka ................. H05K 3/244
                                                205/125
(Continued)

FOREIGN PATENT DOCUMENTS

CN    101214149 A    7/2008
CN    106548946 A    3/2017
(Continued)

Primary Examiner — Stefanie S Wittenberg
(74) Attorney, Agent, or Firm — WHDA, LLP

(57) ABSTRACT

The present disclosure provides a method for forming a via hole in a flexible substrate, including: providing a base substrate and forming a de-bonding layer on the base substrate; forming a seed metal layer on the de-bonding layer, and patterning the seed metal layer to form a first conductive pattern; forming a first flexible substrate on the seed metal layer; forming a first mask layer on the first flexible substrate; and forming a first via hole in the flexible substrate though a dry etching process, the first via hole penetrating the first flexible substrate to expose a connection region of the first conductive pattern. The present disclosure further provides a method for filling a via hole in a flexible substrate.

10 Claims, 11 Drawing Sheets

(51) Int. Cl.
*C25D 5/56* (2006.01)
*C25D 7/12* (2006.01)
*G03F 7/00* (2006.01)
*G03F 7/16* (2006.01)

(56) References Cited

U.S. PATENT DOCUMENTS

| | | | |
|---|---|---|---|
| 2002/0148733 A1* | 10/2002 | Saito | H05K 3/4623 |
| | | | 205/333 |
| 2015/0247758 A1* | 9/2015 | Kurth | G01J 5/20 |
| | | | 216/13 |
| 2016/0071816 A1* | 3/2016 | Huang | H01L 21/6835 |
| | | | 257/738 |
| 2017/0086306 A1 | 3/2017 | Nakamura et al. | |
| 2020/0286921 A1 | 9/2020 | Liu et al. | |

FOREIGN PATENT DOCUMENTS

| | | |
|---|---|---|
| CN | 109887948 A | 6/2019 |
| CN | 111769216 A | 10/2020 |
| CN | 112242414 A | 1/2021 |
| CN | 112652697 A | 4/2021 |

* cited by examiner

METHODS FOR FORMING VIA HOLE AND FILLING VIA HOLE IN FLEXIBLE SUBSTRATE

CROSS-REFERENCE TO RELATED APPLICATION

This application is the U.S. national phase of PCT Application No. PCT/CN2021/133505 filed on Nov. 26, 2021, the entire contents of which are hereby incorporated by reference.

TECHNICAL FIELD

The present disclosure relates to the manufacture of a display product, in particular to a method for forming a via hole in a flexible substrate and a method for filling a via hole in a flexible substrate.

BACKGROUND

Three-Dimension (3D) integration has become a main development direction of advanced packaging in recent years to meet requirements on miniaturization, high integration level and multi-function of electronic products. Originally, 3D packaging is Trough Silicon Via (TSV) technology based on a silicon substrate, and later a 3D integrated Trough Glass Via (TGV) technology based on a glass substrate is developed due to such advantages of the glass substrate as high-density interconnection and low-loss transmission.

Along with an increase in the integration level of the electronic products, an internal space of the product is limited, so internal elements of the electronic product are required to be light, thin, and even flexible to meet the narrow and distorted space. Under this background, flexible printed circuit boards have been widely used. However, due to low manufacturing precision and relatively simple function, the flexible printed circuit boards are merely used for interconnection, switching, and as base substrates for larger elements. Accuracy of a conventional processing technology of the flexible printed circuit board is tens of microns, e.g., a micro-hole with a diameter of about 40 μm is formed in an adhesive-free polyimide substrate with a thickness of 25 μm through an excimer laser cutting technology, but during the laser cutting, an edge is ablated to form burrs. In the case that the substrate is made of special photosensitive liquid polyimide liquid, a micro-hole with a diameter of about 10 μm is formed, but the manufacture cost is greatly increased.

As a development trend, the product is provided with a better integration level and miniaturized internal elements, so the elements of the product need to be flexible and thin as possible. A via hole is formed in a polyimide (PI) substrate through micron-scale patterning in a thin film semiconductor process in conjunction with a dry etching process. However, after the formation of the via hole, the PI substrate needs to be transferred on a glass substrate to achieve double-sided patterning, and at this time, the difficulty in the manufacture process increases.

SUMMARY

An object of the present disclosure is to provide a method for forming a via hole in a flexible substrate and a method for filling a via hole in a flexible substrate, so as to simplify the manufacturing process when the via hole is formed in a PI substrate to achieve double-sided, patterned interconnection.

In one aspect, the present disclosure provides in some embodiments a method for forming a via hole in a flexible substrate, including: providing a base substrate and forming a de-bonding layer on the base substrate: forming a seed metal layer on the de-bonding layer, and patterning the seed metal layer to form a first conductive pattern; forming a first flexible substrate on the seed metal layer: forming a first mask layer on the first flexible substrate; and forming a first via hole in the flexible substrate though a dry etching process, the first via hole penetrating through the first flexible substrate to expose a connection region of the first conductive pattern.

In a possible embodiment of the present disclosure, the forming the first flexible substrate on the seed metal layer includes coating a polyimide liquid, and post-baking and curing the polyimide liquid to form the first flexible substrate.

In a possible embodiment of the present disclosure, prior to forming the seed metal layer on the de-bonding layer and patterning the seed metal layer to form the first conductive pattern, the method further includes forming a contact metal layer on the de-bonding layer to increase an adhesive force of the seed metal layer.

In a possible embodiment of the present disclosure, the contact metal layer is made of at least one of molybdenum, titanium and nickel.

In a possible embodiment of the present disclosure, the forming the first mask layer on the first flexible substrate includes depositing an inorganic thin film on the flexible substrate, and patterning the inorganic thin film to form the first mask layer with a hollowed-out region and a shielding region.

In a possible embodiment of the present disclosure, the forming the first via hole though the dry etching process includes dry etching the first flexible substrate with a plasma to remove a part of the first flexible substrate exposed by the hollowed-out region to form a vertical via hole.

In a possible embodiment of the present disclosure, the forming the first mask layer on the first flexible substrate includes coating a photoresist on the first flexible substrate, and patterning the photoresist to form the first mask layer with the hollowed-out region and the shielding region.

In a possible embodiment of the present disclosure, the forming the first via hole though the dry etching process includes removing a part of the first flexible substrate exposed by the hollowed-out region through the dry etching process to form a V-shaped via hole.

In another aspect, the present disclosure provides in some embodiments a method for filling a via hole in a flexible substrate, including: forming the first via hole in the flexible substrate through the above-mentioned method; filling the first via hole with a conductive metal through an electroplating process: and removing the de-bonding layer through laser to remove the first flexible substrate from the base substrate.

In a possible embodiment of the present disclosure, the first via hole includes a first actual via hole and a first dummy via hole, and the filling the first via hole with the conductive metal through the electroplating process includes: forming a first etch stopping barrier in the first dummy via hole; filling the first actual via hole with the conductive metal through the electroplating process: removing the first etch stopping barrier in the first dummy via hole to expose a first to-be-etched region of the seed metal layer: removing the first to-be-etched region through a wet etching process: and filling the first dummy via hole with a photoresist through a photolithography process to form a first planarization layer.

In a possible embodiment of the present disclosure, the method further includes: depositing a metal layer, and patterning the metal layer to form a second conductive pattern: forming a second flexible substrate: forming a second via hole in the second flexible substrate through the above-mentioned method, the second via hole penetrating through the second flexible substrate to expose a connection region of the second conductive pattern: filling the second via hole with the conductive metal through an electroplating process: and removing the de-bonding layer through laser to remove the first flexible substrate from the base substrate.

In a possible embodiment of the present disclosure, the second via hole includes a second actual via hole and a second dummy via hole, and the filling the second via hole with the conductive metal through the electroplating process includes: forming a second etch stopping barrier in the second dummy via hole: filling the second actual via hole with the conductive metal: removing the second etch stopping barrier in the second dummy via hole to expose a second to-be-etched region of the seed metal layer: removing the second to-be-etched region through a wet etching process: and filling the second dummy via hole with the photoresist through a photolithography process to form a second planarization layer.

The present disclosure has the following beneficial effects. The seed metal layer is formed on the base substrate and patterned to form the first conductive pattern, then the flexible substrate is formed, and then the via hole is formed in the flexible substrate. As a result, when a metal layer coupled to the first conductive pattern through the via hole is formed subsequently, the other functional layers may be directly formed on the metal layer, so as to simplify the manufacture process.

DETAILED DESCRIPTION

Figure 1:
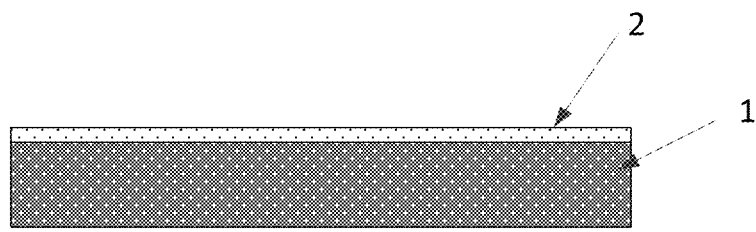
FIG. 1 is a schematic view showing a situation where a de-bonding layer is formed on a base substrate according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In the embodiments of the present disclosure, it should be appreciated that, such words as "in the middle of", "on/above", "under/below", "left", "right", "vertical", "horizontal", "inside" and "outside" may be used to indicate directions or positions as viewed in the drawings, and they are merely used to facilitate the description in the present disclosure, rather than to indicate or imply that a device or member must be arranged or operated at a specific position. In addition, such words as "first", "second" and "third" may be merely used to differentiate different components rather than to indicate or imply any importance.

In the related art, a via hole is formed in a flexible substrate, a first metal layer is formed at a first side of the flexible substrate, and then the flexible substrate needs to be transferred and overturned on a base substrate to form a second metal layer at a second side of the flexible substrate opposite to the first side, so as to achieve double-sided patterned interconnection. Hence, the manufacture process is complicated, and thereby the difficulty in the manufacture process increases.

Figure 2:
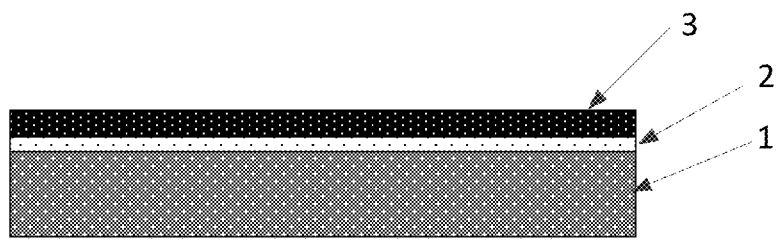
FIG. 2 is a schematic view showing a situation where a seed metal layer is formed on the de-bonding layer according to one embodiment of the present disclosure.
Figure 3:
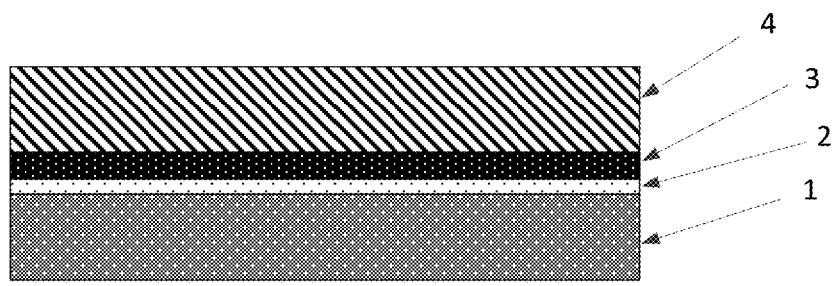
FIG. 3 is a schematic view showing a situation where a first flexible substrate is formed on the seed metal layer according to one embodiment of the present disclosure.
Figure 4:
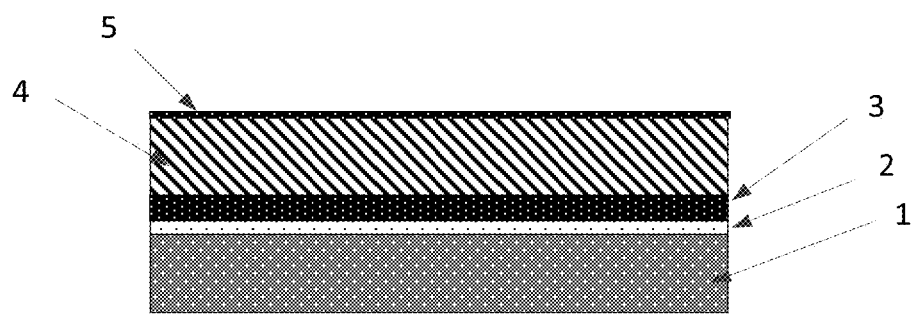
FIG. 4 is a schematic view showing a situation where an inorganic thin film is formed on first flexible substrate according to one embodiment of the present disclosure.
Figure 5:
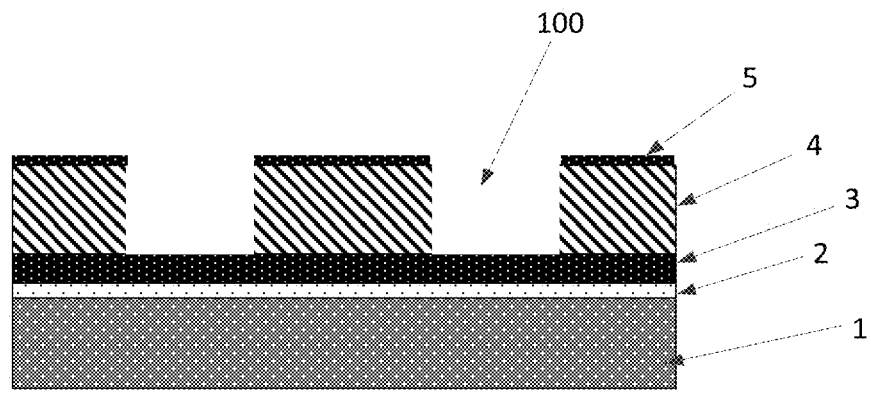
FIG. 5 is a schematic view showing a situation where a first via hole is formed according to one embodiment of the present disclosure.
Figure 7:
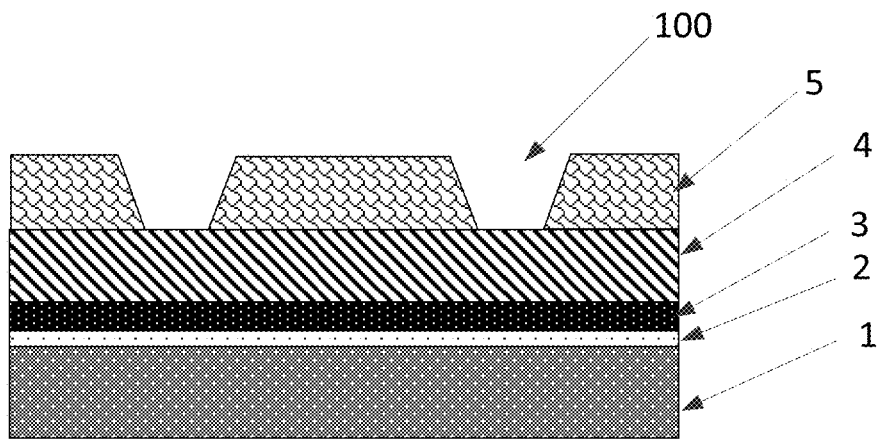
FIG. 7 is a schematic view showing a situation where a photoresist is coated on a flexible substrate and a first mask layer is formed according to one embodiment of the present disclosure.
Figure 8:
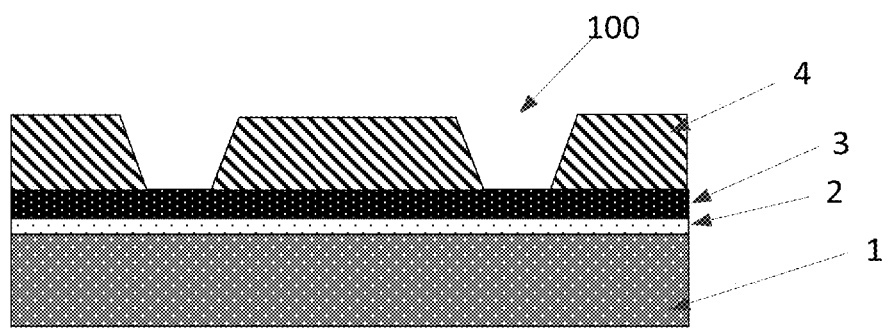
FIG. 8 is another schematic view showing the situation where the first via hole is formed according to one embodiment of the present disclosure.
Figure 13:
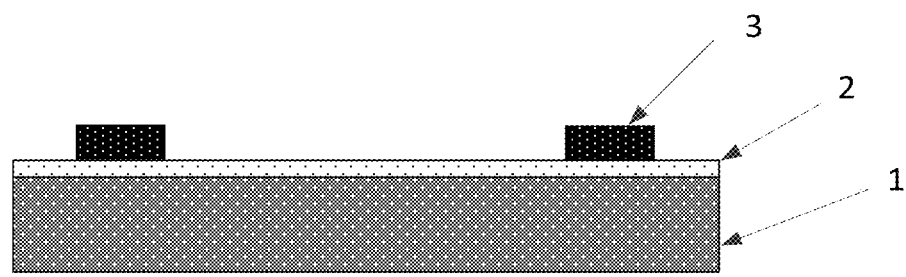
FIG. 13 is another schematic view showing the situation where the seed metal layer is formed on the de-bonding layer according to one embodiment of the present disclosure.
Figure 14:
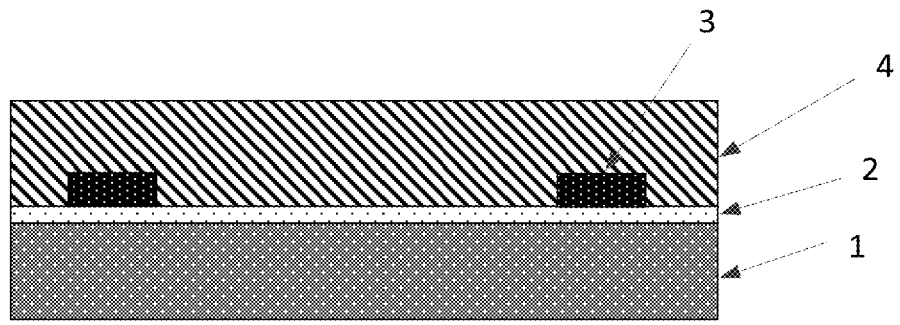
FIG. 14 is another schematic view showing the situation where the first flexible substrate is formed on the seed metal layer according to one embodiment of the present disclosure.
Figure 15:
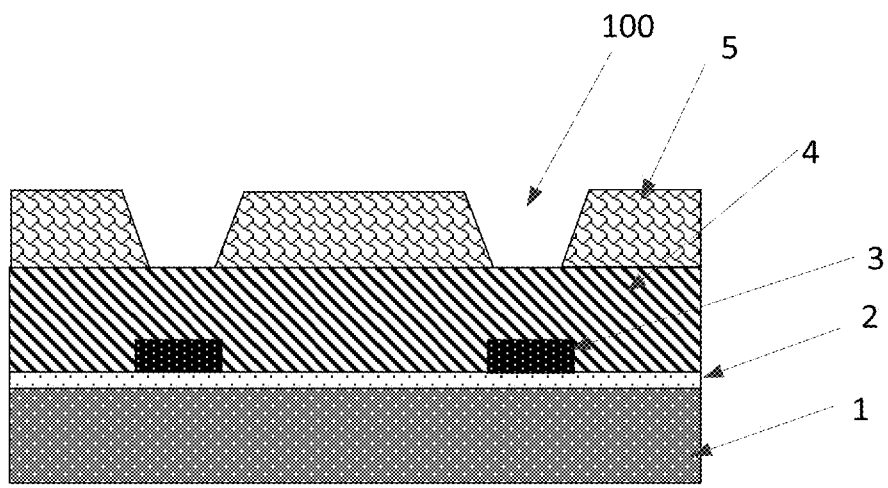
FIG. 15 is another schematic view showing the situation where the first mask layer is formed on first flexible substrate according to one embodiment of the present disclosure.
Figure 16:
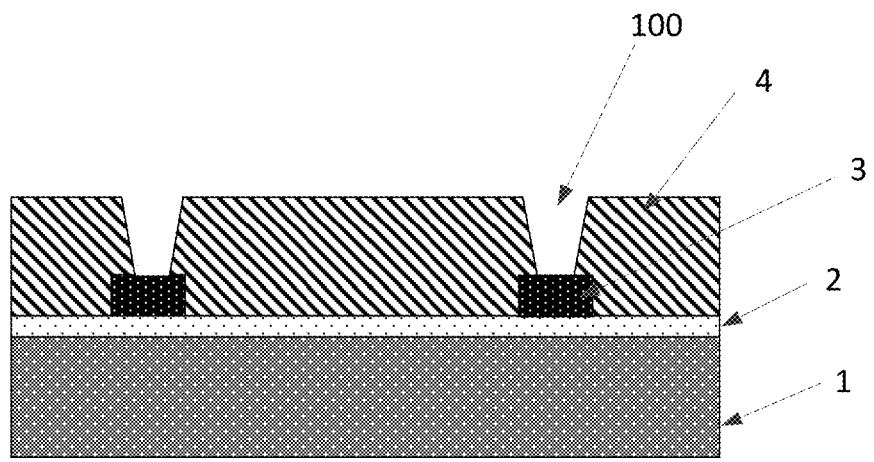
FIG. 16 is yet another schematic view showing the situation where the first via hole is formed according to one embodiment of the present disclosure.
Figure 23:
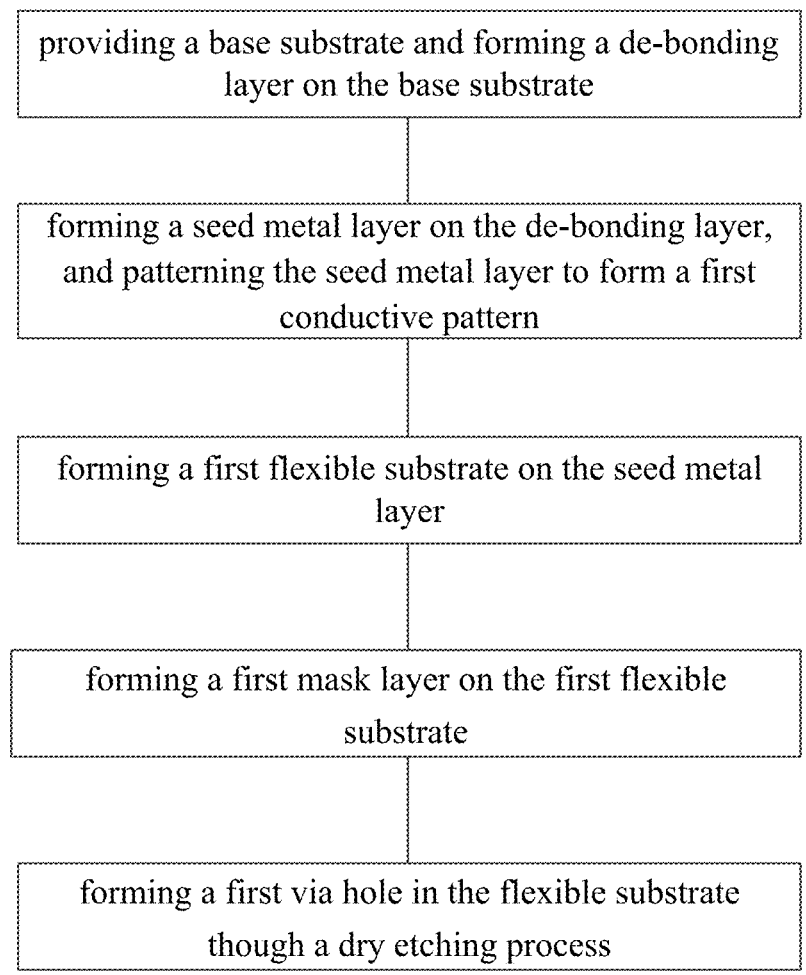
FIG. 23 is a flow chart of a method for forming the first via hole according to one embodiment of the present disclosure.

As shown in FIG. 23, in view of the above technical problems, the present disclosure provides in some embodiments a method for forming a via hole in a flexible substrate, which includes: providing a base substrate 1 and forming a de-bonding layer 2 on the base substrate 1, as shown in FIG. 1: forming a seed metal layer 3 on the de-bonding layer 2, and patterning the seed metal layer 3 to form a first conductive pattern, as shown in FIG. 2 and FIG. 13: forming a first flexible substrate 4 on the seed metal layer 3, as shown in FIG. 3: forming a first mask layer 5 on the first flexible substrate 4, as shown in FIG. 4 and FIG. 7: and forming a first via hole 100 in the flexible substrate though a dry etching process, as shown in FIG. 5 and FIG. 8.

In the embodiments of the present disclosure, the seed metal layer 3 is formed on the base substrate 1 directly, and patterned to form the first conductive pattern, i.e., the seed metal layer 3 not only is provided with a function of a seed metal, but also forms a conductive pattern with a predetermined function through patterning, e.g., connection lines and driving circuitries. The first flexible substrate 4 is formed on the seed metal layer 3, the first via hole 100 is formed in the first flexible substrate 4, and a patterned metal layer is formed directly at a side of the first flexible substrate 4 away from the base substrate after filling the first via hole 100 with a conductive metal, so as to achieve double-sided patterned interconnection based on the flexible substrate. In addition, during the manufacture, it is unnecessary to transfer the flexible substrate, and the other metal layers may be directly formed. As a result, it is able to reduce the quantity of steps, thereby to reduce the difficulty in the manufacture process.

It should be appreciated that, in the embodiments of the present disclosure, the base substrate 1 is, but not limited to, a glass substrate.

It should be appreciated that, the de-bonding layer 2 may be made of a material capable of being vaporized under laser ablation. The de-bonding layer 2 merely has a thickness of tens of nanometers, and it is vaporized under the laser ablation to remove the seed metal layer 3 from the base substrate 1 without any extra organic residues, so it is able to prevent electrical connection of a metal on a back surface of the first flexible substrate 4 (i.e., the first conductive pattern) from being adversely affected.

It should be appreciated that, the seed metal layer 3 is formed through depositing a metal layer through sputtering or evaporation, and then the metal layer is patterned to form the first conductive pattern, i.e., the first conductive pattern may be electrically coupled to the other circuitries to achieve corresponding functions, and may also serve as a seed metal in a subsequent electroplating process.

In the embodiments of the present disclosure, the forming the first flexible substrate 4 on the seed metal layer 3 includes coating a polyimide liquid, and post-baking and curing the polyimide liquid to form the first flexible substrate 4.

In the embodiments of the present disclosure, prior to forming the seed metal layer 3 on the de-bonding layer 2 and patterning the seed metal layer 3 to form the first conductive pattern, the method further includes forming a contact metal layer on the de-bonding layer 2 to increase an adhesive force of the seed metal layer 3.

Through the contact metal layer, it is able to increase the adhesive force of the seed metal layer 3, thereby to prevent the seed metal layer 3 from being separated from the base substrate 1 in a subsequent process.

In the embodiments of the present disclosure, the contact metal layer is made of at least one of molybdenum (Mo), titanium (Ti) and nickel (Ni). The contact metal layer may be made of one or more of Mo, Ti and Ni, such as a molybdenum titanium nickel (MTD) metal (Mo—Ti—Ni alloy).

In the embodiments of the present disclosure, the forming the first mask layer 5 on the first flexible substrate 4 includes depositing an inorganic thin film on the flexible substrate, and patterning the inorganic thin film to form the first mask layer 5 with a hollowed-out region and a shielding region.

The inorganic thin film may be made of various materials, such as silicon oxide (SiOx) or silicon nitride (SINx).

In the embodiments of the present disclosure, the forming the first via hole though the dry etching process includes dry etching the first flexible substrate 4 with a plasma to remove a part of the first flexible substrate exposed by the hollowed-out region to form a vertical via hole.

It should be appreciated that, when the first flexible substrate 4 is dry etched, the plasma may be $O_2$, so as to merely etch an organic matter rather than an inorganic matter, so the inorganic thin film may serve as a mask.

In the embodiments of the present disclosure, the first mask layer 5 is, but not limited to, an inorganic thin film. In the embodiments of the present disclosure, the forming the first mask layer 5 on the first flexible substrate 4 includes coating a photoresist on the first flexible substrate 4, and patterning the photoresist to form the first mask layer 5 with a hollowed-out region and a shielding region.

In the embodiments of the present disclosure, the forming the first via hole 100 though a dry etching process includes removing a part of the first flexible substrate exposed by the hollowed-out region to form a V-shaped via hole through the dry etching process, as shown in FIG. 7.

Through forming the first mask layer 5 with the photoresist, it is able to form the V-shaped via hole at different angles through adjusting an exposure amount.

It should be appreciated that, during the formation of the V-shaped via hole, post-baking is not used, so as to prevent the V-shaped via hole formed though exposure from being collapsed, thereby to control the shape of the V-shaped via hole conveniently.

Figure 6:
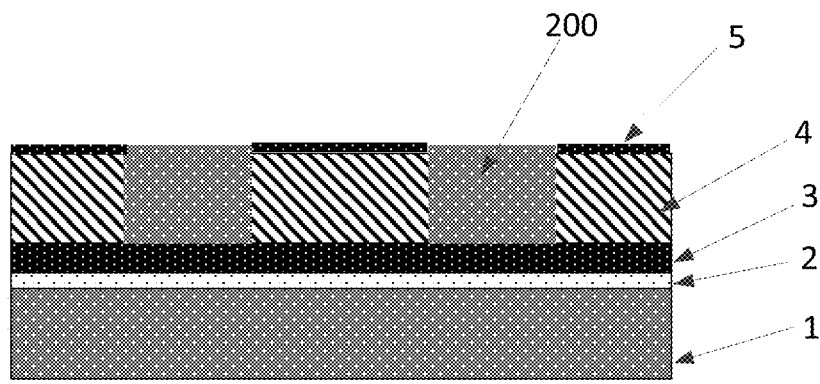
FIG. 6 is a schematic view showing a situation where the first via hole is filled with a conductive metal according to one embodiment of the present disclosure.
Figure 9:
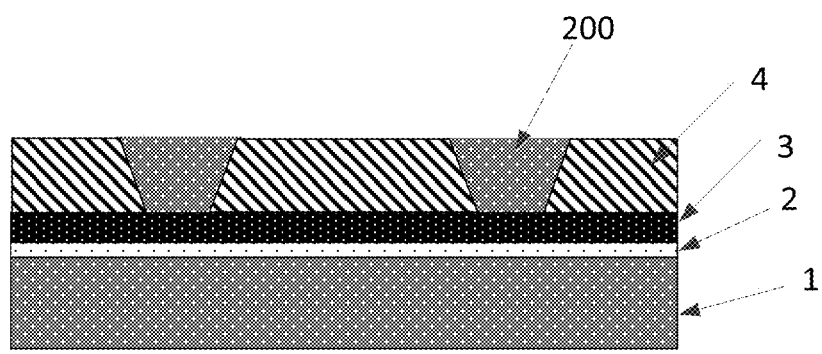
FIG. 9 is another schematic view showing the situation where the first via hole is filled with the conductive metal according to one embodiment of the present disclosure.
Figure 24:
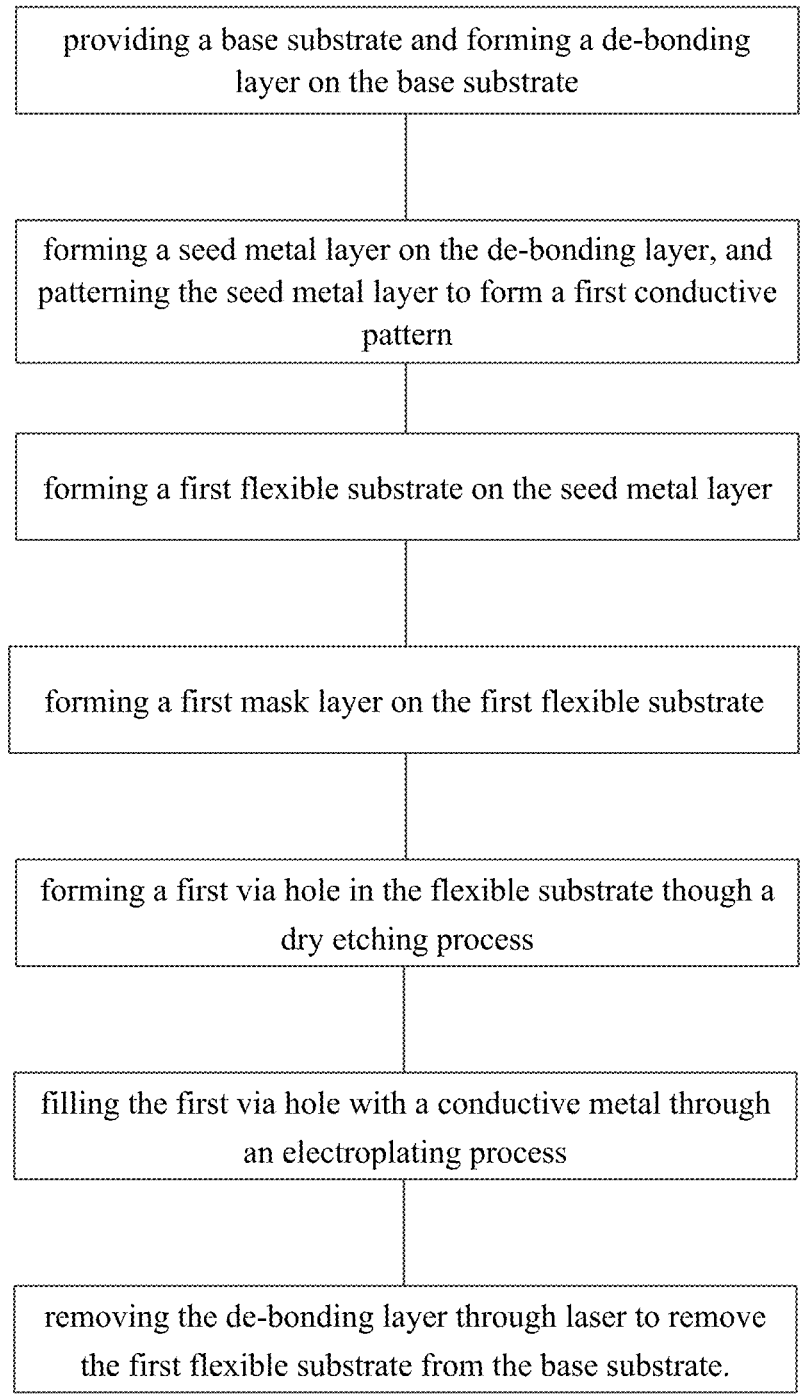
FIG. 24 is a flow chart of a method for filling the first via hole with the conductive metal according to one embodiment of the present disclosure.

As shown in FIG. 24, the present disclosure further provides in some embodiments a method for filling a via hole in a flexible substrate, which includes: forming the first via hole 100 in the flexible substrate 4 through the above-mentioned method: filling the first via hole 100 with a conductive metal 200 through an electroplating process, as shown in FIG. 6 and FIG. 9: and removing the de-bonding layer 2 through laser to remove the first flexible substrate 4 from the base substrate 1.

As compared with a conventional laser drilling process, in the embodiments of the present disclosure, a photolithography process is used for the patterning, and the via hole is formed through dry etching, so it is able to form a micron-scale micro-hole. In addition, the mask layer is made of the photoresist or an inorganic material (e.g., SiOx or SiNx), so it is able to form micro-grooves at different slope angles.

When the flexible substrate is dry etched, a lateral etching problem usually occurs due to alignment, and an Under Cut structure is formed under the mask layer. When the via holes are formed through sputtering or evaporation, there is a risk of disconnection under the mask layer. In the embodiments of the present disclosure, in order to achieve stable electrical connection, the via holes are completely filled with metal through the electroplating process, so as to improve the electrical connection, the packaging sealability as well as the conductivity.

In the electroplating process, an electroplating region is required to be coupled to a peripheral circuitry to receive electric charges. When the quantity of the electroplating regions is small, the electroplating regions may be directly coupled to the peripheral circuitry: When the quantity of the electroplating regions is large and not distributed at an edge of the substrate, the electroplating regions need to be coupled to each other to form a plurality of paths and then coupled to the peripheral circuitry. However, for the function of the elements, electrodes of the elements should be independent of each other, so an original electroplated path needs to be interrupted.

Figure 10:
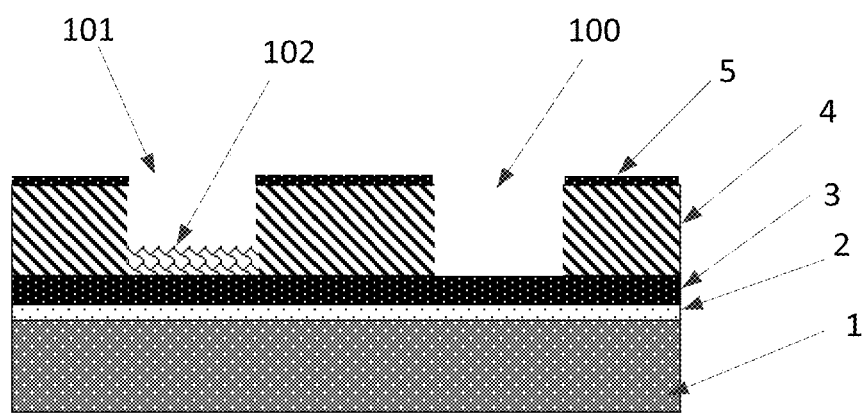
FIG. 10 is a schematic view showing a situation where a first etch stopping barrier is formed according to one embodiment of the present disclosure.
Figure 11:
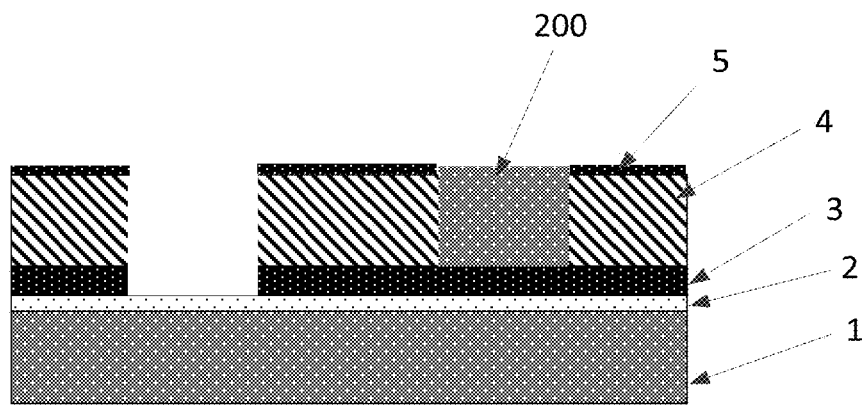
FIG. 11 is a schematic view showing a situation where a to-be-etched region in the seed metal layer is etched according to one embodiment of the present disclosure.
Figure 12:
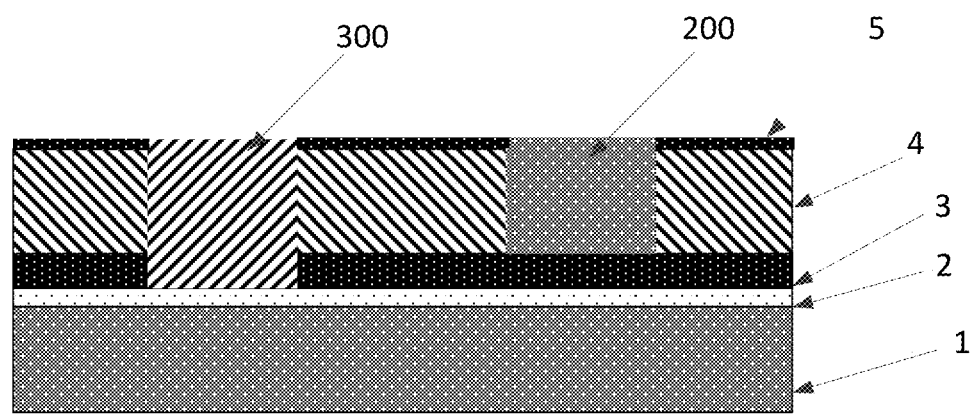
FIG. 12 is a schematic view showing a situation where a first planarization layer is formed in a first dummy via hole according to one embodiment of the present disclosure.

In the embodiments of the present disclosure, the first via hole 100 includes a first actual via hole and a first dummy via hole 101. The filling the first via hole 100 with the conductive metal 200 through the electroplating process includes: forming a first etch stopping barrier 102 in the first dummy via hole 101, as shown in FIG. 10: filling the first actual via hole with the conductive metal 200 through the electroplating process, as shown in FIG. 11: removing the first etch stopping barrier 102 in the first dummy via hole 101 to expose a first to-be-etched region of the seed metal layer 3: removing the first to-be-etched region through a wet etching process (due to a huge thickness difference between a thickness of the seed metal layer 3 in the first dummy via hole 101 and a sum of a thickness of the conductive metal 200 in the first actual via hole and a thickness of the seed metal layer 3 after the electroplating process, the first to-be-etched region may be directly wet etched): and filling the first dummy via hole with the photoresist through a photolithography process to form a first planarization layer 300, as shown in FIG. 12.

Based on the above, functional electrodes are coupled to each other during the electroplating and are decoupled from each other after the electroplating, i.e., the first dummy via hole 101 is not filled with the conductive metal 200 to enable electrodes at a same layer to be decoupled from each other, and the first actual via hole is filled with the conductive metal 200 to enable functional electrodes at opposite sides of the first flexible substrate 4 to be coupled to each other.

Figure 17:
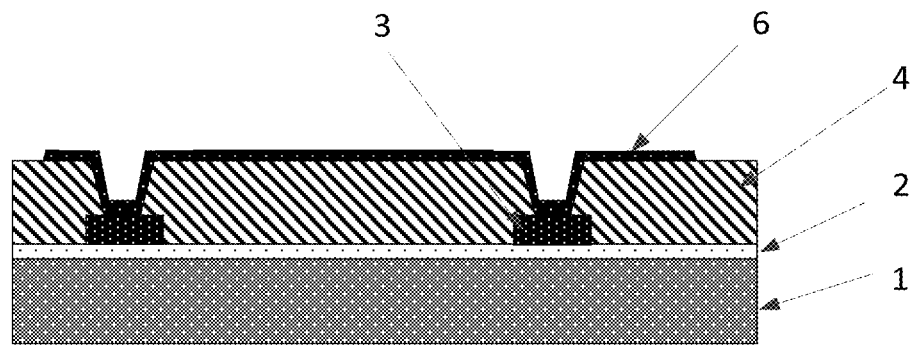
FIG. 17 is a schematic view showing a situation where a second conductive pattern is formed according to one embodiment of the present disclosure.
Figure 18:
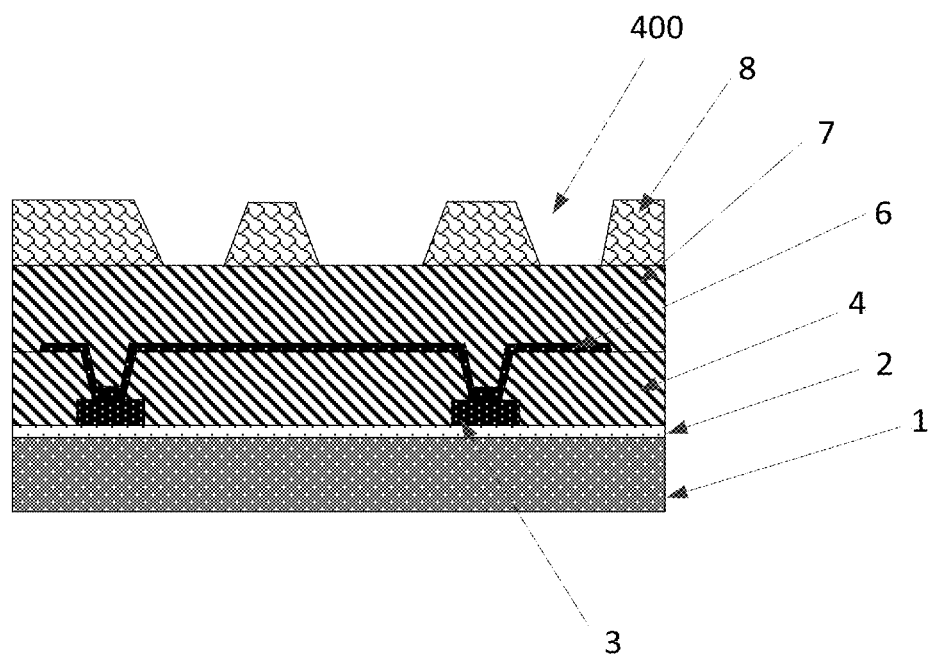
FIG. 18 is a schematic view showing a situation where a second flexible substrate is formed according to one embodiment of the present disclosure.

FIG. 13 to FIG. 16 show a situation where the first flexible substrate 4 is formed on the base substrate 1 and the first via hole 100 is formed in the first flexible substrate 4. In the embodiments of the present disclosure, the method further includes: depositing a metal layer, and patterning the metal layer to form a second conductive pattern 6, as shown in FIG. 17: forming a second flexible substrate 7, as shown in FIG. 18: forming a second via hole 400 in the second flexible substrate 7 through the above-mentioned method (forming a second mask layer 8 on the second flexible substrate 7, and then forming the second via hole 400): filling the second via hole 400 with the conductive metal 200 through the electroplating process: and removing the de-bonding layer 2 through laser to remove the first flexible substrate 4 from the base substrate 1.

Based on the above, it is able to achieve the switching of circuitries in a multi-layer structure. It should be further appreciated that, the quantity of the flexible substrates will not be particularly defined herein. In the embodiments of the present disclosure, the flexible substrates includes the first flexible substrate 4 and the second flexible substrate 7, and more flexible substrates laminated one on another may be provided according to the practical need. The via holes may be formed in the flexible substrates, and the metal layers are coupled to each other through filling the via holes as mentioned hereinabove.

Based on the above, the flexible substrates are laminated one on another, so as to achieve electrical connection and improve the packaging sealability of the substrates.

Figure 19:
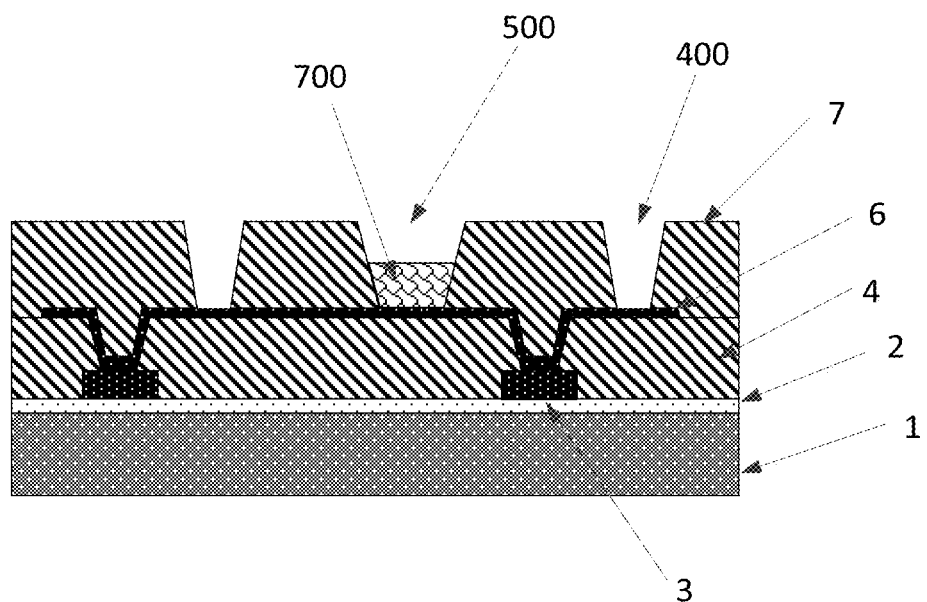
FIG. 19 is a schematic view showing a situation where a second etch stopping barrier is formed in a second dummy via hole according to one embodiment of the present disclosure.
Figure 20:
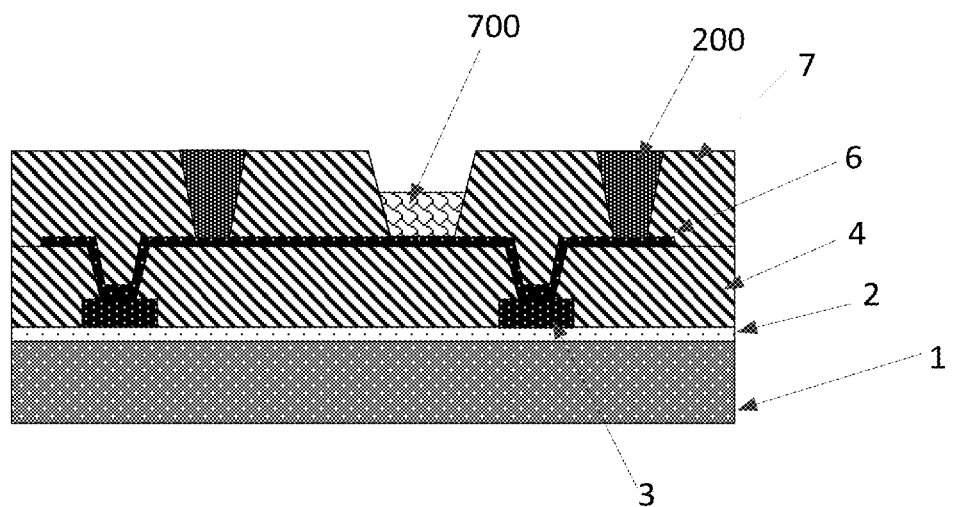
FIG. 20 is a schematic view showing a situation where a second actual via hole is filled with the conductive metal according to one embodiment of the present disclosure.
Figure 21:
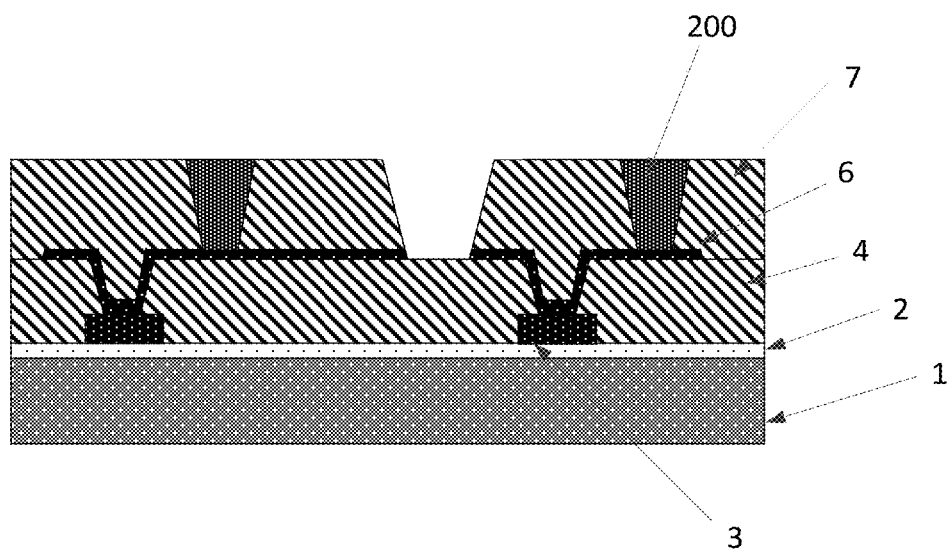
FIG. 21 is a schematic view showing a situation where a to-be-etched region in the second conductive pattern is etched according to one embodiment of the present disclosure.
Figure 22:
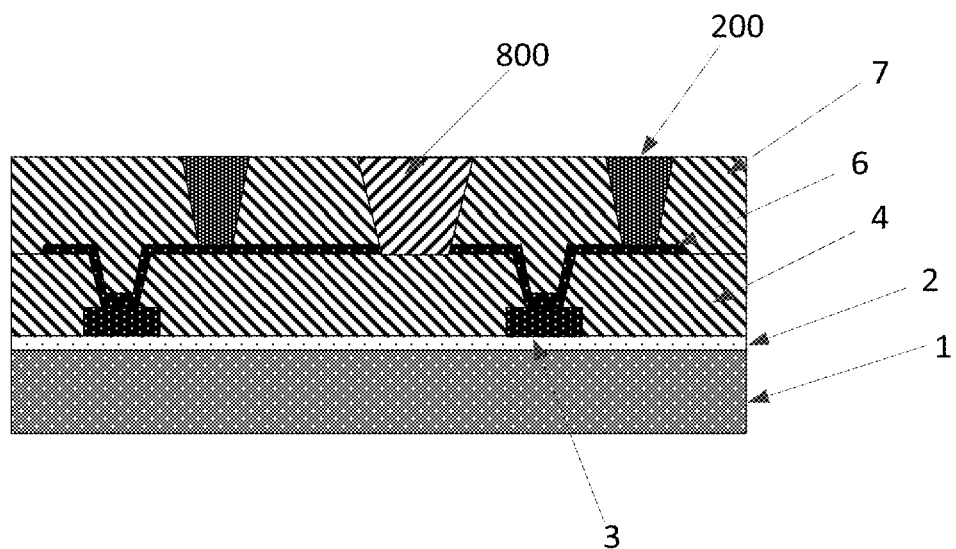
FIG. 22 is a schematic view showing a situation where a second planarization layer is formed in the second dummy via hole according to one embodiment of the present disclosure.

In the embodiments of the present disclosure, the second via hole 400 includes a second actual via hole and a second dummy via hole 500. The filling the second via hole 400 with the conductive metal 200 through the electroplating process includes: forming a second etch stopping barrier 700 in the second dummy via hole 500, as shown in FIG. 19: filling the second actual via hole with the conductive metal 200, as shown in FIG. 20: removing the second etch stopping barrier 700 in the second dummy via hole 500 to expose a second to-be-etched region of the seed metal layer 3; removing the second to-be-etched region through a wet etching process, as shown in FIG. 21: and filling the second dummy via hole with the photoresist through a photolithography process to form a second planarization layer 800, as shown in FIG. 22.

During the multi-layer electroplating, it is able to interrupt the circuit as mentioned hereinabove.

The present disclosure has the following beneficial effects.

It is able for the metal layers at opposite sides of the flexible substrate made of polyimide to be coupled to each other. Driving circuitries and the other circuitries are bonded to a back surface of the flexible substrate (i.e., the first conductive pattern), so as to increase an active area of a display device. Through removing the de-bonding layer 2 through laser, the patterned metal layer is formed on the back surface of the flexible substrate, i.e., the patterned metal layer is used as the first conductive pattern to achieve a circuit connection function and it is also used as the seed layer.

It is able to form the micro-hole. As compared with the conventional laser drilling process, in the embodiments of the present disclosure, the photolithography process is used for the patterning, and the dry etching is used to form the via hole, so as to form the micron-scale micro-hole. In addition, the mask layer is formed through the photoresist or an inorganic material (such as SiOx or SiNx), so it is able to form the micro-groove at different slope angles.

It is able to completely fill the via hole with metal, so as to prevent the occurrence the Under Cut structure when the flexible substrate is etched through dry etching, and improve the electrical connection as well as the packaging sealability. As compared with the conventional methods such as sputtering, evaporation, and immersion in a conductive solution, in the embodiments of the present disclosure, a bottom metal layer (i.e., the seed metal layer 3 formed on the base substrate 1) is used as the electroplating seed layer, and after the electroplating, the via hole is filled with the conductive metal 200 (such as copper) to improve the conductivity.

Figure 25:
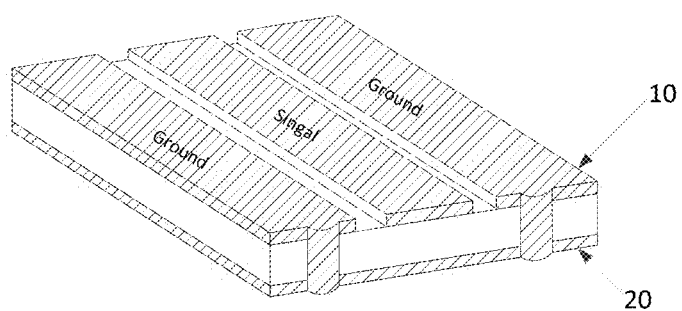
FIG. 25 is a schematic view showing a coplanar waveguide transmission line.

The method may be applied to the field of display technology to achieve bezel-free display, so that the circuitry at a front surface of the flexible substrate is coupled to flexible printed circuit boards (FPCs) at the back surface of the flexible substrate through the via hole in the flexible substrate. As compared with a mode that the FPC is bent to the back surface of the flexible substrate and then coupled to a driving integrated circuit (IC), it is able to achieve narrow-bezel display, even bezel-free display. Different from an existing folding mode, the method may be applied to splicing display, thereby to provide an oversized or special-shaped display screen. The method may also be used in the field of radio frequency, for example, in a coplanar waveguide transmission line. As shown in FIG. 25, a ground plane of a top metal layer 10 is coupled to a ground plane of a bottom metal layer 20 through small micro-holes. This is extremely important to meet the strict requirements of a multiple input multiple output (MIMO) on-screen antenna on a metal line width in wireless communication at a millimeter wave band or a higher wave band.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A method for filling a via hole in a flexible substrate, comprising:
  forming the first via hole in the flexible substrate through:
    providing a base substrate and forming a de-bonding layer on the base substrate;
    forming a seed metal layer on the de-bonding layer, and patterning the seed metal layer to form a first conductive pattern;
    forming a first flexible substrate on the seed metal layer;
    forming a first mask layer on the first flexible substrate; and
    forming a first via hole in the flexible substrate through a dry etching process, the first via hole penetrating through the first flexible substrate to expose a connection region of the first conductive pattern;
  filling the first via hole with a conductive metal through an electroplating process; and
  removing the de-bonding layer through laser to remove the first flexible substrate from the base substrate;
  wherein the first via hole comprises a first actual via hole and a first dummy via hole, wherein the filling the first via hole with the conductive metal through the electroplating process comprises:
  forming a first etch stopping barrier in the first dummy via hole;
  filling the first actual via hole with the conductive metal through the electroplating process;
  removing the first etch stopping barrier in the first dummy via hole to expose a first to-be-etched region of the seed metal layer;
  removing the first to-be-etched region through a wet etching process; and
  filling the first dummy via hole with the photoresist through a photolithography process to form a first planarization layer.

2. The method according to claim 1, further comprising:
  depositing a metal layer, and patterning the metal layer to form a second conductive pattern;
  forming a second flexible substrate;
  forming a second via hole in the second flexible substrate through:
    providing a base substrate and forming a de-bonding layer on the base substrate;
    forming a seed metal layer on the de-bonding layer, and patterning the seed metal layer to form the second conductive pattern;
    forming the second flexible substrate on the seed metal layer;
    forming a second mask layer on the second flexible substrate; and
    forming the second via hole in the second flexible substrate though through a dry etching process, the second via hole penetrating through the second flexible substrate to expose a connection region of the second conductive pattern;
  filling the second via hole with the conductive metal through the electroplating process; and
  removing the de-bonding layer through laser to remove the first flexible substrate from the base substrate.

3. The method according to claim 2, wherein the second via hole comprises a second actual via hole and a second dummy via hole, wherein the filling the second via hole with the conductive metal through the electroplating process comprises:
  forming a second etch stopping barrier in the second dummy via hole;
  filling the second actual via hole with the conductive metal;
  removing the second etch stopping barrier in the second dummy via hole to expose a second to-be-etched region of the seed metal layer;
  removing the second to-be-etched region through a wet etching process; and
  filling the second dummy via hole with the photoresist through a photolithography process to form a second planarization layer.

4. The method according to claim 1, wherein the forming the first flexible substrate on the seed metal layer comprises coating a polyimide liquid, and post-baking and curing the polyimide liquid to form the first flexible substrate.

5. The method according to claim 4, wherein prior to forming the seed metal layer on the de-bonding layer and patterning the seed metal layer to form the first conductive pattern, the method further comprises forming a contact metal layer on the de-bonding layer to increase an adhesive force of the seed metal layer.

6. The method according to claim 5, wherein the contact metal layer is made of at least one of molybdenum, titanium and nickel.

7. The method according to claim 4, wherein the forming the first mask layer on the first flexible substrate comprises depositing an inorganic thin film on the flexible substrate, and patterning the inorganic thin film to form the first mask layer with a hollowed-out region and a shielding region.

8. The method according to claim 7, wherein the forming the first via hole through the dry etching process comprises dry etching the first flexible substrate with a plasma to remove a part of the first flexible substrate exposed by the hollowed-out region to form a vertical via hole.

9. The method according to claim 4, wherein the forming the first mask layer on the first flexible substrate comprises coating a photoresist on the first flexible substrate, and patterning the photoresist to form the first mask layer with a hollowed-out region and a shielding region.

10. The method according to claim 9, wherein the forming the first via hole through the dry etching process comprises removing a part of the first flexible substrate exposed by the hollowed-out region through the dry etching process to form a V-shaped via hole.

\* \* \* \* \*